United States Patent
Inaba

(10) Patent No.: US 8,329,592 B2
(45) Date of Patent: Dec. 11, 2012

(54) METHOD OF FABRICATING SEMICONDUCTOR DEVICE, AND PHOTOMASK

(75) Inventor: Satoshi Inaba, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 501 days.

(21) Appl. No.: 12/556,152

(22) Filed: Sep. 9, 2009

(65) Prior Publication Data

US 2010/0183958 A1 Jul. 22, 2010

(30) Foreign Application Priority Data

Jan. 21, 2009 (JP) ................. 2009-010653

(51) Int. Cl.
*H01L 21/302* (2006.01)
(52) U.S. Cl. ........... 438/717; 438/723; 438/736; 216/46
(58) Field of Classification Search .................. 438/595, 438/706, 710, 714, 717, 723, 735, 725, 736; 430/310, 312; 216/46, 47
See application file for complete search history.

(56) References Cited

U.S. PATENT DOCUMENTS

| | | | |
|---|---|---|---|
| 7,456,481 B2 | 11/2008 | Inaba et al. | |
| 7,776,683 B2 * | 8/2010 | Tran et al. | 438/241 |
| 2008/0248622 A1 * | 10/2008 | Matamis et al. | 438/261 |
| 2008/0308848 A1 | 12/2008 | Inaba | |
| 2008/0308880 A1 | 12/2008 | Inaba | |
| 2009/0311861 A1 * | 12/2009 | Park et al. | 438/689 |

OTHER PUBLICATIONS

A. Kaneko et al., "Sidewall Transfer Process and Selective Gate Sidewall Spacer Formation Technology for Sub-15nm Fin FET with Elevated Source/Drain Extension", IEDMTech. Dig., 2005, 4 pages.

* cited by examiner

*Primary Examiner* — Lan Vinh
(74) *Attorney, Agent, or Firm* — Oblon, Spivak, McClelland, Maier & Neustadt, LLP

(57) ABSTRACT

A method of fabricating a semiconductor device according to one embodiment includes: forming a mask material on a semiconductor substrate comprising first and second regions; forming a pattern of a core on the mask material in the first region; forming a sidewall spacer mask on a side surfaces of the core pattern and subsequently removing the core pattern; transferring a pattern of the sidewall spacer mask to the mask material in the first region after removing the core; and thereafter, carrying out trimming of the pattern of the sidewall spacer mask which is transferred to the mask material in the first region, and formation of a predetermined pattern on the mask material in the second region, simultaneously.

15 Claims, 9 Drawing Sheets

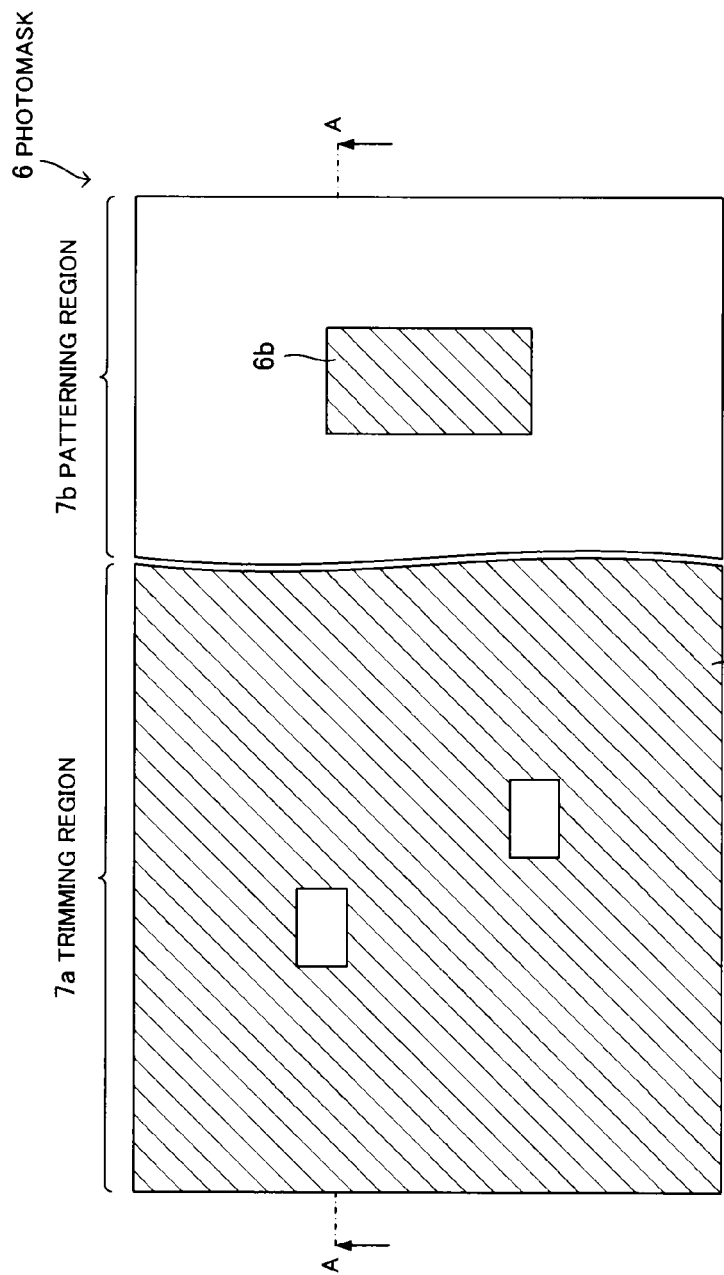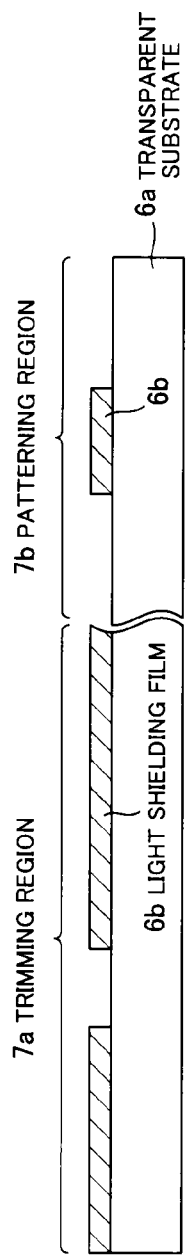
FIG. 4A
FIG. 4B

METHOD OF FABRICATING SEMICONDUCTOR DEVICE, AND PHOTOMASK

CROSS-REFERENCE TO RELATED APPLICATIONS

This application is based upon and claims the benefit of priority from prior Japanese Patent Application No. 2009-010653, filed on Jan. 21, 2009, the entire contents of which are incorporated herein by reference.

BACKGROUND

A conventional fabrication (patterning) technique is known in which a sidewall spacer is formed on a side surfaces of a dummy pattern which is called a core, and after removing the core, a microscopic pattern is formed on a semiconductor substrate using the sidewall spacer as an etching mask. Since a width of the mask composed of the sidewall spacer is determined by a deposited thickness of a material film of the mask before shaped into a sidewall shape or by etching time during the shaping, more accurate dimension control, including line width control, is possible than by conventional lithography. Thanks to this method, it is possible to reduce variation of mask dimension compared to a broadly used etching hard mask formation method using a combination of a resist coating and lithographic exposure. This technique, for example, is disclosed in a non-patent literary document of A. Kaneko et al., IEDM Tech. Dig. pp. 863-866, 2005.

However, since the sidewall spacer mask has a ring pattern surrounding a periphery of the core due to formation method thereof, it is necessary to trim the sidewall spacer mask to shape the ring pattern into a line-and-space pattern by applying additional lithography process and an etching process again using a mask called a pattern cut mask or a trimming mask in order to use the sidewall spacer mask as a mask for forming a linear pattern called line-and-space on the workpiece material.

Specifically, when a fin of an SRAM cell, or another type of memory cell such as DRAM, composed of FinFET is formed applying a line-and-space pattern, a mask having in a critical design level having a submicroscopic pattern must be used as a patterning photomask for core formation and a trimming photomask for a sidewall spacer mask. Therefore, the production cost of the entire chip including cost of the mask becomes high. In addition, for a photolithography process using these photomasks, it is necessary to use a lithography technique (e.g., immersion lithography, etc.) which is good at controllability of dimension or overlay accuracy but is highly difficult and at high cost.

BRIEF SUMMARY

A method of fabricating a semiconductor device according to one embodiment includes: forming a mask material on a semiconductor substrate comprising first and second regions; forming a pattern of a core on the mask material in the first region; forming a sidewall spacer mask on a side surfaces of the core pattern and subsequently removing the core pattern; transferring a pattern of the sidewall spacer mask to the mask material in the first region after removing the core; and thereafter, carrying out trimming of the pattern of the sidewall spacer mask which is transferred to the mask material in the first region, and formation of a predetermined pattern on the mask material in the second region, simultaneously.

A method of fabricating a semiconductor device according to another embodiment includes: forming a mask material on a semiconductor substrate; shaping the mask material, thereby forming a region with a ring pattern formed thereon and a region without ring pattern; and thereafter, carrying out trimming of the ring pattern of the mask material into a line-and-space pattern and formation of a predetermined pattern in the region of the mask material without ring pattern simultaneously by using a photolithography technique using a photomask having both a pattern for trimming a ring pattern of a workpiece material into a line-and-space pattern and a pattern for forming a predetermined pattern in a region of the workpiece material without ring pattern.

A photomask according to another embodiment includes: a first pattern for trimming a ring pattern of a workpiece material into a line-and-space pattern; and a second pattern for forming a pattern in a region of the workpiece material without ring pattern.

BRIEF DESCRIPTION OF THE DRAWING

FIGS. 4A and 4B are a plan view and a cross sectional view of a photomask according to the embodiment.

DETAILED DESCRIPTION

Embodiment

Structure of Semiconductor Device

Figure 1:
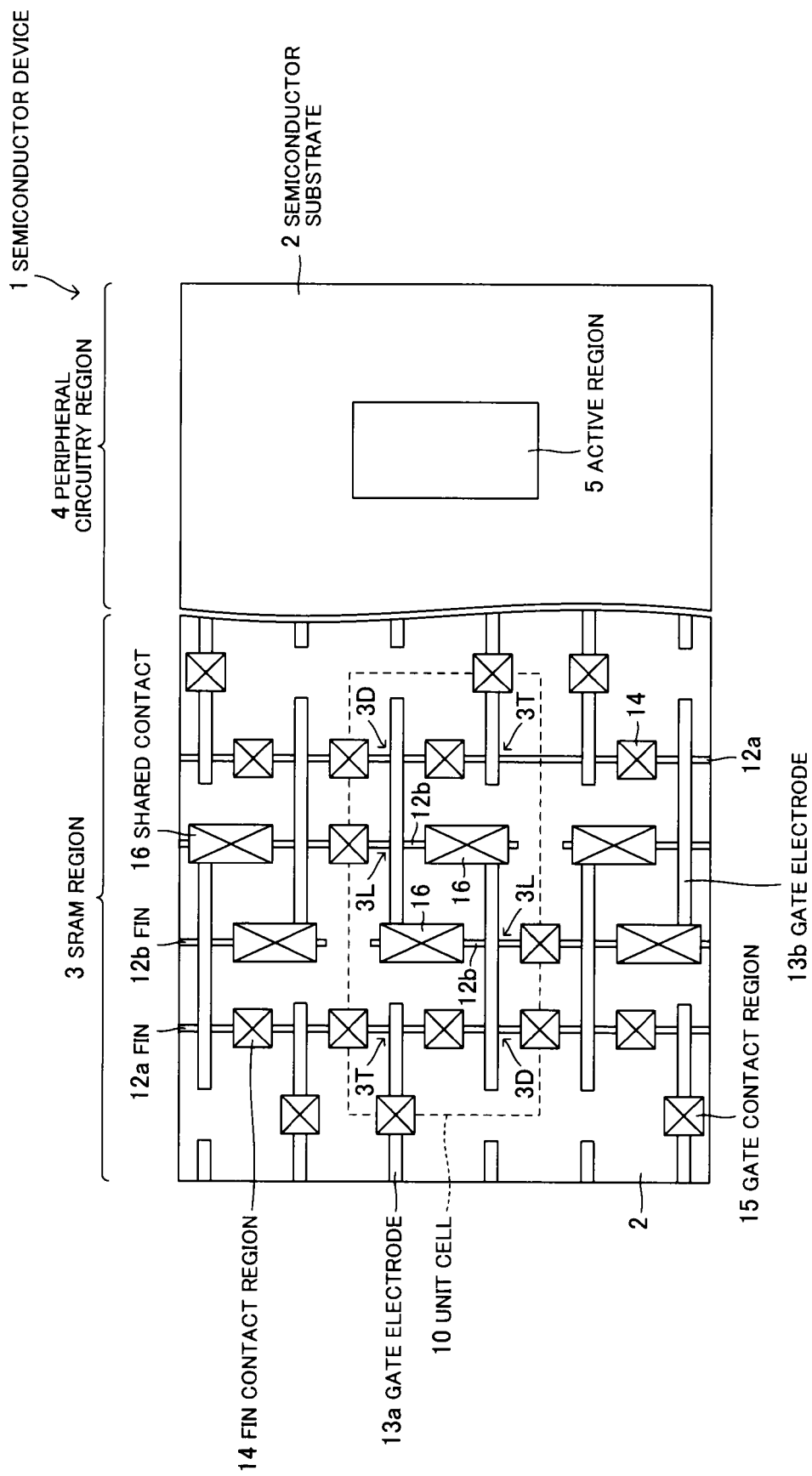
FIG. 1 is a plan view of a semiconductor device according to an embodiment.

FIG. 1 is a plan view of a semiconductor device 1 according to an embodiment. On a semiconductor substrate 2, the semiconductor device 1 has an SRAM region 3 in which an SRAM (Static Random Access Memory) cell is formed, and a peripheral circuitry region 4 in which peripheral circuits (not shown) such as a flip-flop or a sensor amplifier, etc., are formed in an active region 5.

An SRAM cell is formed in the SRAM region 3. In the present embodiment, six transistor type of SRAM cell composed of fin-type transistors will be explained as an example. The six transistor type SRAM cell has two each of n-type transfer transistor, n-type driver transistor and p-type load transistor in one unit cell 10.

Three types of transistors, which are an n-type transfer transistor 3T, an n-type driver transistor 3D and a p-type load transistor 3L, a fin 12a including source/drain regions (not shown) of the transfer transistor T and the driver transistor 3D, a fin 12b including a source/drain region (not shown) of the load transistor 3L, a gate electrode 13a used for the transfer transistor 3T and a gate electrode 13b commonly used for the driver transistor 3D and the load transistor 3L are formed in the SRAM region 3.

For the semiconductor substrate 2, it is possible to use, for example, a Si substrate, a SiGe substrate, or a substrate combined thereof by a partial selective epitaxial growth method, etc.

The fins 12a and 12b are formed by, e.g., etching a surface of the semiconductor substrate 2, and are made of single crystal Si or single crystal SiGe, etc. In addition, the fins 12a and 12b include source/drain regions on both sides of the gate electrodes 13a and 13b.

An n-type impurity such as As or P, etc., is contained in the source/drain regions of the n-type transfer transistor T and the driver transistor D, and a p-type impurity such as B or $BF_2$, etc., is contained in the source/drain region of the p-type load transistor L.

In addition, a fin contact region 14 to be connected to a source region or a drain region is formed at a predetermined position on upper surfaces of the fins 12a and 12b. The fin contact region 14 electrically connects a source region or a drain region of each portion to upper wirings.

The gate electrode 13a contacts with both side surfaces of the fin 12a via a gate insulating film. Meanwhile, the gate electrode 13b contacts with both side surfaces of the fins 12a and 12b via a gate insulating film. Regions of the fins 12a and 12b in contact with the gate electrodes 13a and 13b via the gate insulating film function as a channel region.

The gate electrodes 13a and 13b are made of, e.g., polycrystalline silicon or polycrystalline germanium containing a conductivity type impurity. An n-type impurity such as As or P, etc., is contained in each region of the gate electrodes 13a and 13b, which belongs to the n-type transfer transistor T and the driver transistor D, and a p-type impurity such as B or $BF_2$, etc., is contained in each region of the gate electrodes 13a and 13b, which belongs to the p-type load transistor L.

Note that, a silicide layer may be formed on a surface of each of the gate electrodes 13a and 13b. Alternatively, the gate electrodes 13a and 13b may be a full silicide electrode which is a fully-silicided electrode. In addition, the gate electrodes 13a and 13b may be a metal gate electrode made of W, Ta, Ti, Hf, Zr, Ru, Pt, Ir, Mo, Al or Ni, etc., or a compound thereof. In addition, the gate electrodes 13a and 13b may have a laminated structure of a metal gate electrode portion and a polycrystalline Si electrode portion. In addition, a gate sidewall spacer made of an insulating material may be each formed on side surfaces of each of the gate electrodes 13a and 13b.

In addition, a gate contact region 15 is formed at a predetermined position on the upper surfaces of the gate electrode 13a. The gate contact region 15 electrically connects the gate electrode 13a to an upper wiring. Furthermore, a shared contact 16 which is a contact shared by the gate electrode 13b and the fin 12b is formed on upper surfaces thereof. The shared contact 16 electrically connects the gate electrode 13b and the fin 12b to upper wirings.

The fin 12b is divided on a boundary of the unit cell 10 on the shared contact 16 side.

(Fabrication of Semiconductor Device)

Figure 2A:
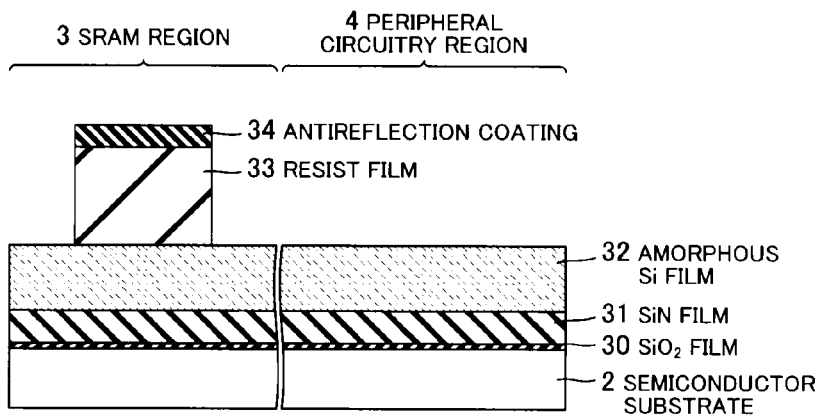
FIGS. 2A to 2N are cross sectional views, which are in a direction perpendicular to a length direction of a fin, showing processes for fabricating the semiconductor device according to the embodiment.
Figure 2B:
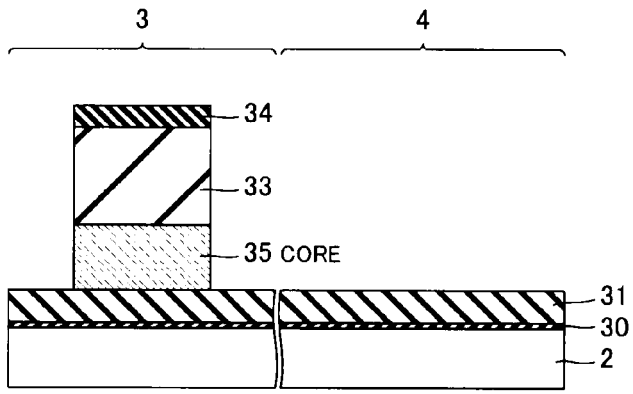
Figure 2C:
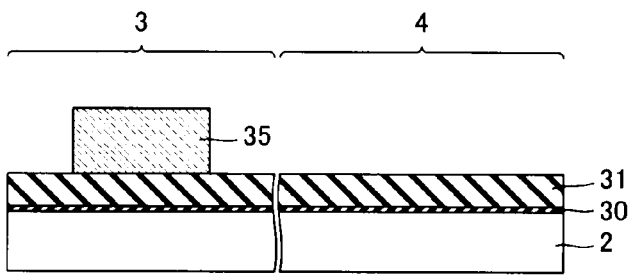
Figure 2D:
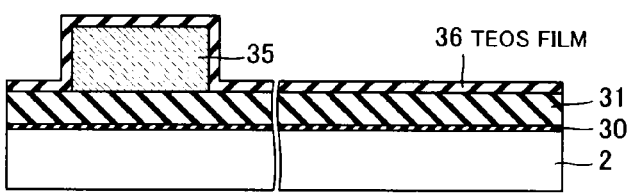
Figure 2E:
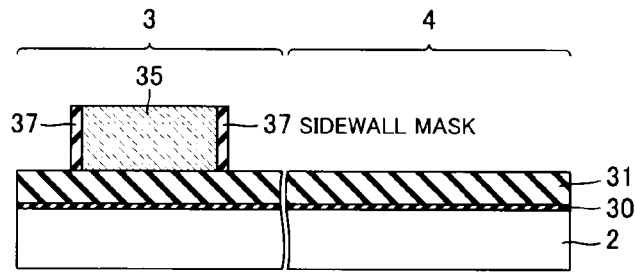
Figure 2F:
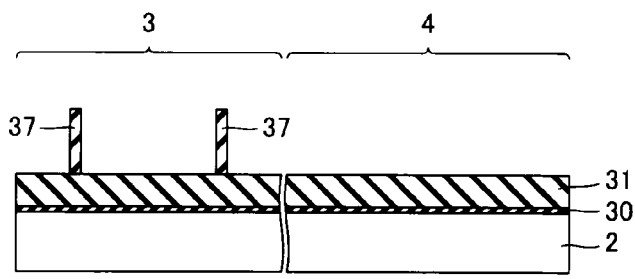
Figure 2G:
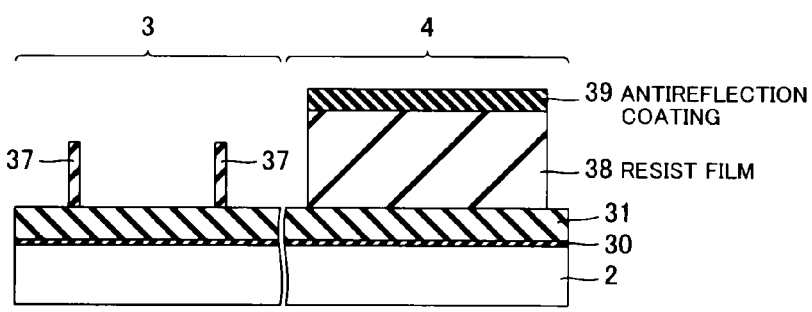
Figure 2H:
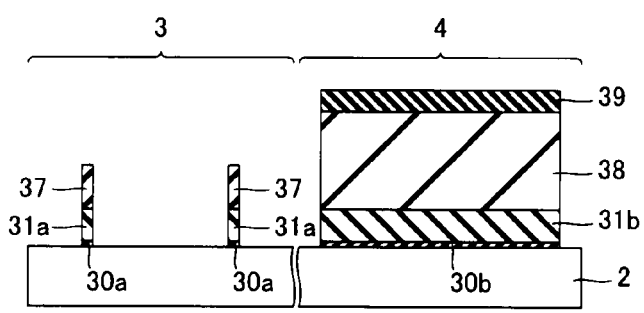
Figure 2I:
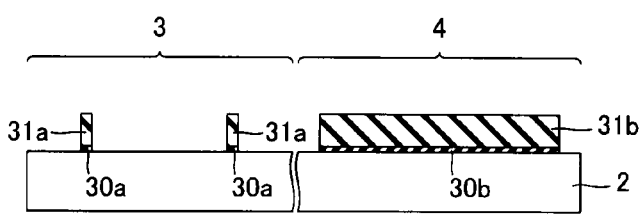
Figure 2J:
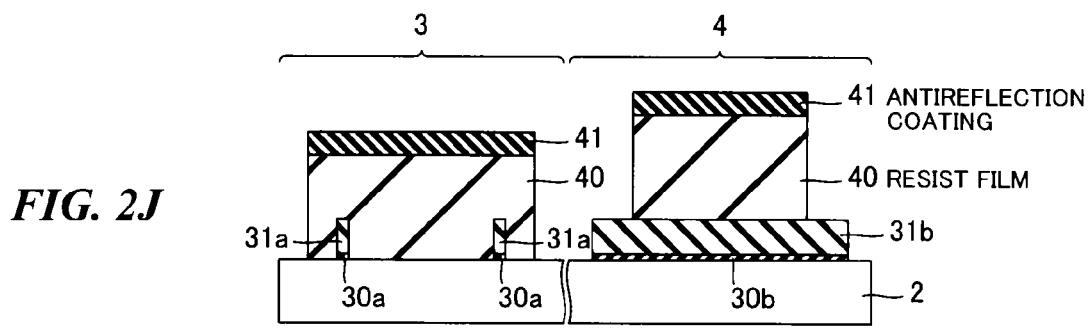
Figure 2K:
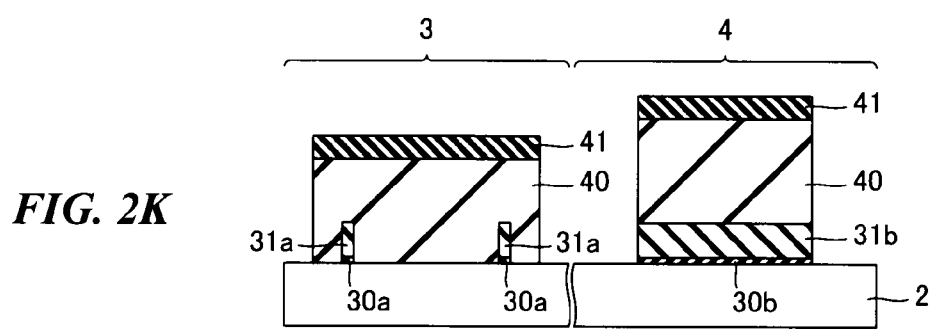
Figure 2L:
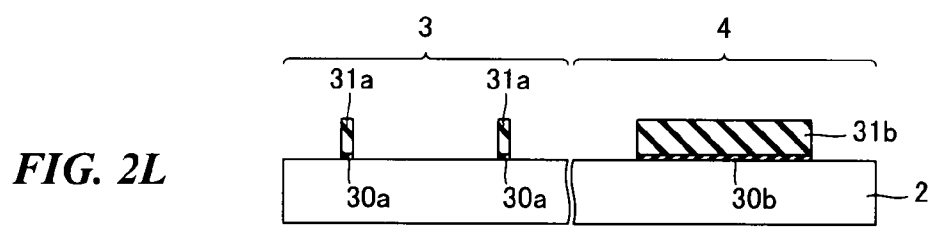
Figure 2M:
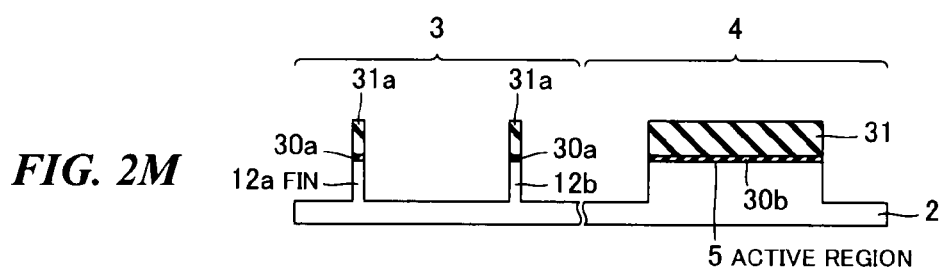
Figure 2N:
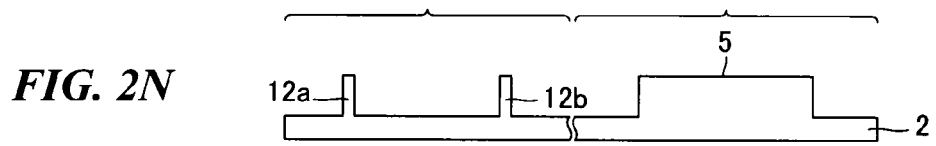

FIGS. 2A to 2N are cross sectional views, which are in a direction perpendicular to a length direction of a fin, showing processes for fabricating the semiconductor device according to the embodiment. In addition, FIGS. 3A to 3F are plan views showing processes for fabricating an SRAM region 3 of the semiconductor device 1 according to the embodiment. Here, FIGS. 3A, 3B, 3C, 3D and 3E respectively correspond to FIGS. 2C, 2E, 2G, 2J and 2L.

Firstly, as shown in FIG. 2A, after laminating a $SiO_2$ film 30, a SiN film 31, an amorphous Si film 32, a resist film 33 and an antireflection coating 34 on the semiconductor substrate 2 in the SRAM region 3 and the peripheral circuitry region 4, a pattern of a below-described core (may be called mandrel) 35 is formed on the resist film 33 and the antireflection coating 34.

The $SiO_2$ film 30, the SiN film 31, the amorphous Si film 32, the resist film 33 and the antireflection coating 34 are formed by a CVD (Chemical Vapor Deposition) method, etc. In addition, the resist film 33 and the antireflection coating 34 are patterned by, for example, a combination of a photolithography method such as an immersion lithography method and an etching method such as a RIE (Reactive Ion Etching) method.

The pattern of the core 35 is submicroscopic, and which is required to have the small edge roughness. Therefore, a photomask in a design level called critical design level having a pattern of 10 nm order (a critical pattern) is used for patterning the resist film 33 and the antireflection coating 34.

In general, higher pattern accuracy is required in the production of a photomask in a critical design level than in that of a photomask in a design level not really submicroscopic, in which minimum pattern size is about 1.0 µm order or larger. Hereinafter, this design level is referred to as "noncritical design level", where the pattern can be exposed by a apparatus not having a maximum level of resolution. In addition, the turnaround time required for manufacturing and testing of the photomask in a critical design level is usually longer than that of the photomask in a noncritical design level. Therefore, the production cost of the photomask in a critical design level is very high.

In addition, since the maximum level of pattern formation capability or pattern overlay accuracy is required in order to perform pattern exposure of the photomask in a critical design level, it is necessary to use a high-performance and expensive photolithography tool. Therefore, the required cost spent for the photolithography process using a photomask in a critical design level is also high.

Next, as shown in FIG. 2B, the amorphous Si film 32 is etched using the resist film 33 and the antireflection coating 34 as a mask, which results in that the amorphous Si film 32 is shaped into the core 35.

Figure 3A:
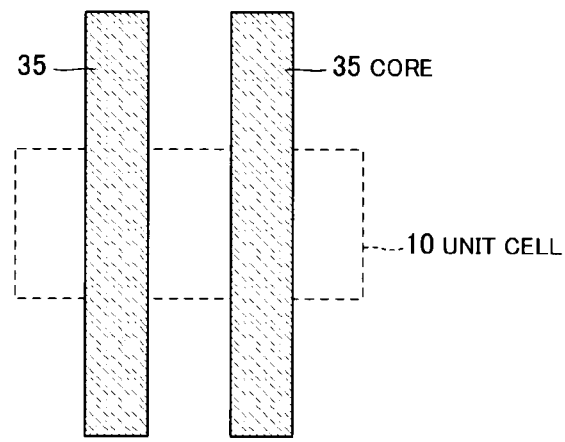
FIGS. 3A to 3F are plan views showing processes for fabricating an SRAM region of the semiconductor device according to the embodiment.

Next, as shown in FIGS. 2C and 3A, the resist film 33 and the antireflection coating 34 are removed by etching.

Next, as shown in FIG. 2D, a TEOS film 36 is formed by the CVD method, etc., so as to conformally cover an upper surface and side surfaces of the core 35.

Figure 3B:
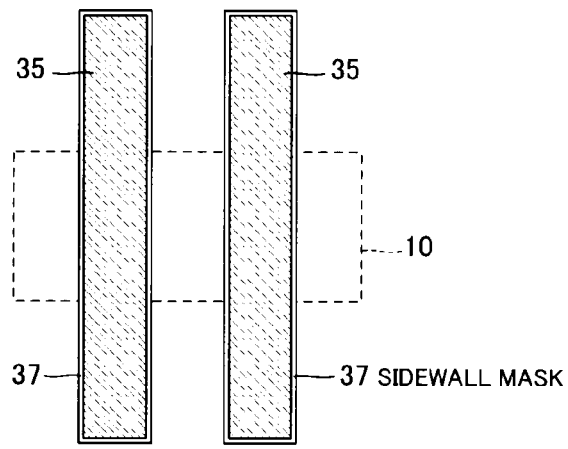

Next, as shown in FIGS. 2E and 3B, the TEOS film 36 is removed by the RIE method, etc., while leaving a portion thereof located on the side surfaces of the core 35, thereby forming a sidewall spacer mask 37. At this stage, the sidewall spacer mask 37 has a ring pattern.

Next, as shown in FIG. 2F, the core 35 is removed by wet etching, etc.

Figure 3C:
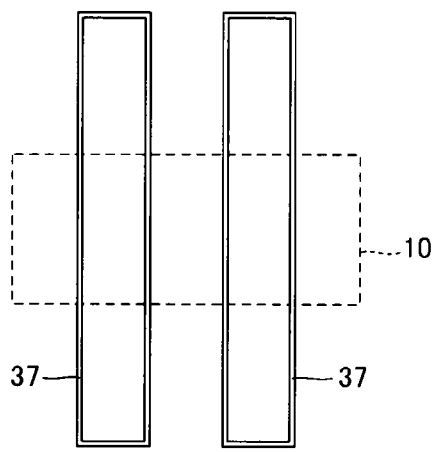

Next, as shown in FIGS. 2G and 3C, a resist film 38 and an antireflection coating 39 are laminated on the SiN film 31 and are subsequently patterned so as to be selectively left in the peripheral circuitry region 4. The pattern of the resist film 38 and the antireflection coating 39 are formed larger than the active region 5, which is formed in a posterior process, by a photolithography method using a photomask in a noncritical design level and an etching method such as the RIE method, etc.

Next, as shown in FIG. 2H, the $SiO_2$ film 30 and the SiN film 31 are etched using the sidewall spacer mask 37, the resist film 38 and the antireflection coating 39 as a mask.

Here, portions of the $SiO_2$ film 30 and the SiN film 31 in the SRAM region 3 to which a ring pattern of the sidewall spacer mask 37 is transferred are respectively defined as a $SiO_2$ film 30a and a SiN film 31a. Meanwhile, portions in the peripheral circuitry region 4, to which the pattern of the resist film 38 and the antireflection coating 39 is transferred, are defined as a $SiO_2$ film 30b and a SiN film 31b. The pattern formed by the resist film 38 and the antireflection coating 39 is larger than the eventually formed pattern of the active region 5. In other words, any pattern does not exist in a region in the $SiO_2$ film 30b and the SiN film 31b including a region to be a mask of the active region 5.

Next, as shown in FIG. 2I, the sidewall spacer mask 37, the resist film 38 and the antireflection coating 39 are removed by etching.

Figure 3D:
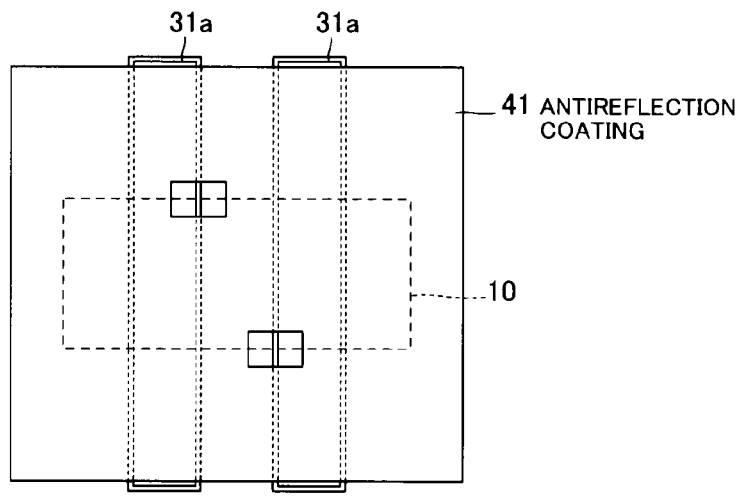

Next, as shown in FIGS. 2J and 3D, a resist film 40 and an antireflection coating 41 are laminated on the whole surface of the semiconductor substrate 2, and are subsequently patterned.

The resist film 40 and the antireflection coating 41 are patterned by a photolithography method such as an immersion lithography method using a photomask in a critical design level, thus, a pattern for trimming the ring pattern transferred to the SiN film 31a into a line-and-space pattern is formed in the SRAM region 3, and a pattern of the active region 5 is formed in the peripheral circuitry region 4. In detail, the trimming of the pattern transferred to the SiN film 31a means that end portions of the rectangular ring pattern of the SiN film 31a in a longitudinal direction are removed for splitting into the fins 12a and 12b, and the pattern of the fin 12b is divided on a boundary of the unit cell 10 on the shared contact 16 side.

FIG. 4A is a plan view of a photomask 6 used for the photolithography process. In addition, FIG. 4B is a cross sectional view of the photomask 6 on cross-section A-A shown in FIG. 4A.

The photomask 6 has a transparent substrate 6a and a light shielding film 6b patterned on the transparent substrate 6a. A pattern formed on the light shielding film 6b includes a trimming region 7a including an opening pattern for trimming the pattern of the fin 12b, and a patterning region 7b including a pattern for forming the pattern of the active region 5. Note that, the light shielding film 6b may be also made of a semi-transparent material which does not completely shield light.

Next, as shown in FIG. 2K, the trimming of the pattern of the SiN film 31a and the transfer of the pattern of the active region 5 to the SiN film 31b are simultaneously carried out by etching the $SiO_2$ film 30b and the SiN film 31b using the resist film 40 and the antireflection coating 41 as a mask.

Figure 3E:
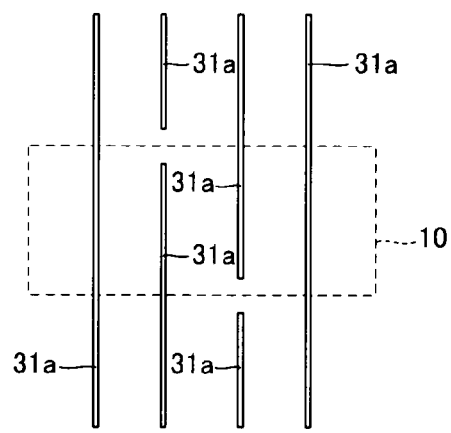

Next, as shown in FIGS. 2L and 3E, the resist film 40 and the antireflection coating 41 are removed by etching. Alternatively, after removing the resist film 40 and the antireflection coating 41, a process of thinning a width of the SiN film 31a having the patterns of the fins 12a and 12b may be carried out, if required.

Next, as shown in FIG. 2M, the semiconductor substrate 2 is etched using the $SiO_2$ films 30a, 30b, the SiN films 31a and 31b as a mask, which results in that the fins 12a, 12b and the active region 5 are formed.

Next, as shown in FIG. 2N, the $SiO_2$ films 30a, 30b, the SiN films 31a and 31b are removed by etching.

Figure 3F:
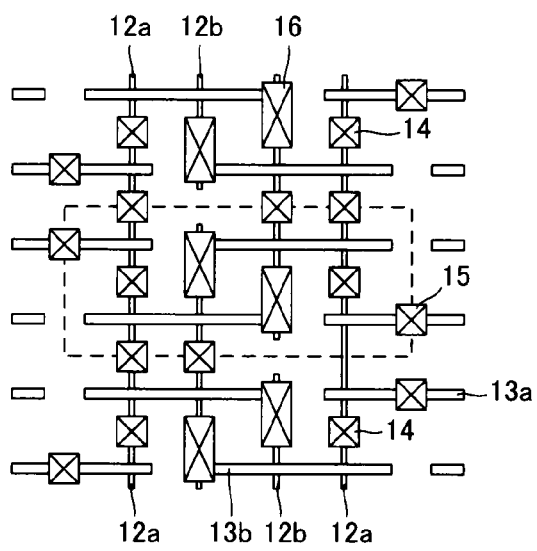

Next, as shown in FIG. 3F, the gate electrodes 13a, 13b, the fin contact 14, the gate contact 15 and the shared contact 16 are formed. In addition, although it is not shown in the figure, peripheral circuits such as a flip-flop or a sensor amplifier, etc., are formed in the active region 5.

COMPARATIVE EXAMPLE

FIGS. 5A to 5G are cross sectional views showing processes for fabricating a semiconductor device by a conventional general method as Comparative Example. Comparative example is different from the embodiment in that formation of mask material pattern for forming a pattern of the active region 5 and formation of mask material pattern for trimming the pattern formed on the SiN film 31a are performed in a separate process. Note that, a semiconductor device formed in Comparative Example has the same structure as the semiconductor device 1 in the present embodiment.

Figure 5A:
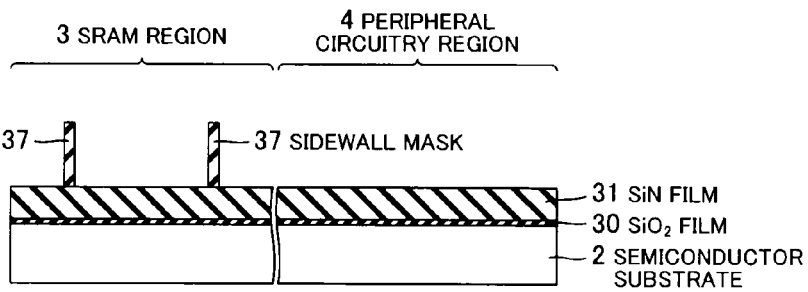
FIGS. 5A to 5G are cross sectional views showing processes for fabricating a semiconductor device by a conventional general method as Comparative Example.

Firstly, as shown in FIG. 5A, the processes until the process, shown in FIGS. 2A to 2F, for removing the core 35 are carried out in the same way as the embodiment.

Figure 5B:
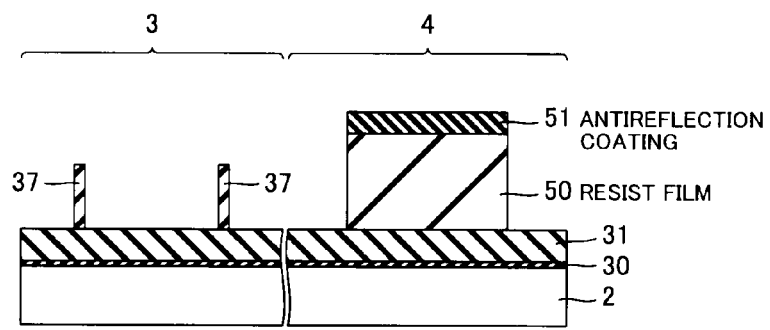

Next, as shown in FIG. 5B, a resist film 50 and an antireflection coating 51 are laminated on the SiN film 31 and are subsequently patterned so as to be selectively left the peripheral circuitry region 4. Here, the pattern of the active region 5 is formed on the resist film 50 and the antireflection coating 51 by a photolithography method such as an immersion lithography method, using a photomask in a critical design level and an etching method such as the RIE method.

Figure 5C:
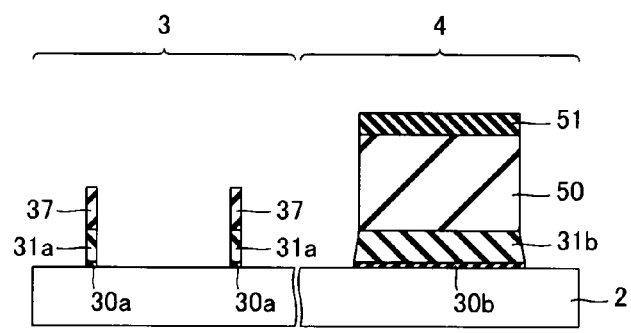

Next, as shown in FIG. 5C, the $SiO_2$ film 30 and the SiN film 31 are etched using the sidewall spacer mask 37, the resist film 50 and the antireflection coating 51 as a mask.

Here, portions of the $SiO_2$ film 30 and the SiN film 31 in the SRAM region 3 to which a pattern of the sidewall spacer mask 37 is transferred are respectively defined as a $SiO_2$ film 30a and a SiN film 31a, and portions in the peripheral circuitry region 4, to which the pattern of the resist film 50 and the antireflection coating 51 are transferred, are defined as a $SiO_2$ film 30b and a SiN film 31b.

Figure 5D:
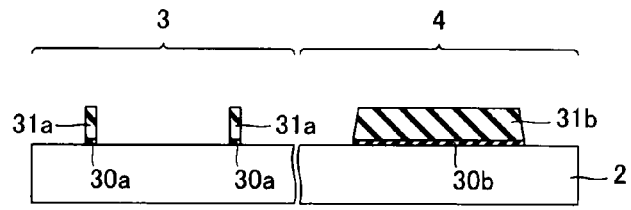

Next, as shown in FIG. 5D, the resist film 50 and the antireflection coating 51 are removed by etching.

Figure 5E:
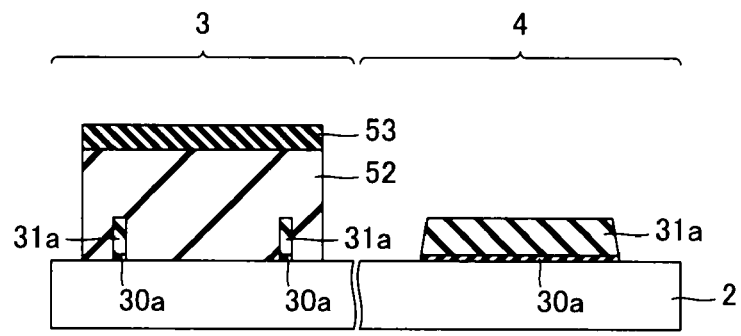

Next, as shown in FIG. 5E, after laminating a resist film 52 and an antireflection coating 53 on the whole surface of the semiconductor substrate 2, a pattern for trimming the pattern formed on the SiN film 31a is formed thereon. Here, the resist film 52 and the antireflection coating 53 are patterned by a photolithography method using a photomask in a critical design level and an etching method such as the RIE method.

Figure 5F:
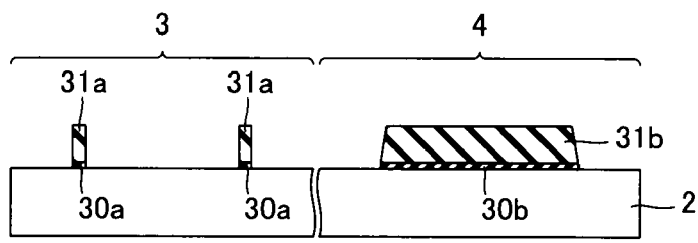

Next, as shown in FIG. 5F, the resist film 52 and the antireflection coating 53 are removed by etching.

Figure 5G:
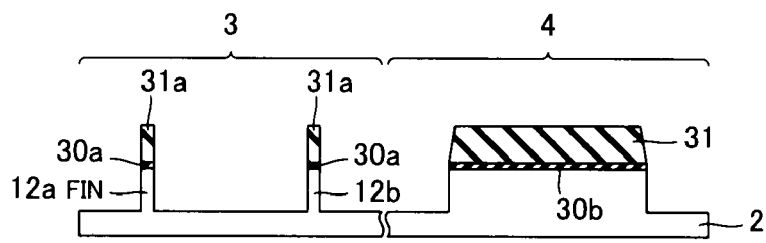

Next, as shown in FIG. 5G, the semiconductor substrate 2 is etched using the $SiO_2$ film 30a, 30b, the SiN film 31a and 31b as a mask, which results in that the fins 12a, 12b and the active region 5 are formed. Note that, the subsequent processes are performed in the same way as the embodiment.

(Effect of the Embodiment)

In above-mentioned Comparative Example, unlike the embodiment, the patterns of the fins 12a and 12b and the patterns of the active region 5 are simultaneously patterned on the $SiO_2$ film 30 and the SiN film 31. At this time, as shown in FIG. 5C, the side surfaces of the SiN film 31b may not be vertically shaped and may become a taper shape.

This is because a dimension conversion difference (a dimensional difference between a pattern on the photomask and a pattern actually formed on a workpiece material) is different between the pattern of the fins 12a and 12b and the pattern of the active region 5 which have different dimensions. In this case, the dimension of the active region 5 differs from the dimension of the photomask pattern. Note that, when trying to vertically form the side surfaces of the SiN film 31, the side surfaces of the SiN film 31a may not become vertical but may become a reverse taper shape.

On the other hand, in the present embodiment, since the patterns of the fins 12a and 12b and the pattern of the active region 5 are formed on the $SiO_2$ film 30 and the SiN film 31 in a separate process, it is possible to perform a correction for a etching condition appropriate for each processed shape at the time of etching based on the dimension conversion difference of each pattern. As a result, it is possible to vertically shape the side surfaces of the SiN films 31a and 31b, thereby forming accurate patterns of the fins 12a, 12b and the active region 5.

In addition, in Comparative Example, a photomask in a critical design level is used in three processes in total, which are a process for forming the pattern of the core 35, a process for forming the pattern of the active region 5 on the resist film 50 and the antireflection coating 51 and a process for forming a pattern for trimming the pattern formed on the SiN film 31a on the resist film 52 and the antireflection coating 53.

On the other hand, in the embodiment, a photomask in a critical design level is used only in two processes, which are a process for forming the pattern of the core 35 and a process for forming a pattern for trimming the pattern formed on the SiN film 31a and a pattern of the active region 5 on the resist film 40 and the antireflection coating 41.

In other words, in the embodiment, since the frequency of using the photomask in a critical design level is less than Comparative Example, it is possible to reduce the production cost of the photomask or a cost for performing highly accurate lithography, thereby reducing the total production cost of the semiconductor device 1.

[Other Embodiments]

It should be noted that the present invention is not intended to be limited to the above-mentioned embodiment, and the various kinds of changes thereof can be implemented by those skilled in the art without departing from the gist of the invention. For example, a combination of films made of different materials may be used instead of the $SiO_2$ film 30, the SiN film 31, the amorphous Si film 32 or the TEOS film 36.

In addition, although a fin used for an SRAM cell and an active region in a peripheral circuitry region have been specifically described as an example of a member having a microscopic line-and-space pattern and a microscopic pattern of the periphery thereof in the above-mentioned embodiment, it is not limited thereto in practice, and it is possible to apply the method for fabricating the semiconductor device shown in the above-mentioned embodiment to a fabrication of a member having the similar pattern, for example another type of memory cell such as DRAM.

What is claimed is:

1. A method of fabricating a semiconductor device, comprising:
    forming a mask material on a semiconductor substrate comprising first and second regions;
    forming a pattern of a core on the mask material in the first region;
    forming a sidewall spacer mask on side surfaces of the core pattern and subsequently removing the core pattern;
    transferring a pattern of the sidewall spacer mask to the mask material in the first region after removing the core; and
    thereafter, carrying out removal of perdetermined parts of the pattern of the sidewall spacer mask which is transferred to the mask material in the first region, so as to divide the pattern of the sidewall spacer mark while a height of the pattern of the sidewall spacer mask other than the predetermined parts remains the same after the removal, while simultaneously carrying out formation of a predetermined pattern on the mask material in the second region.

2. The method of fabricating a semiconductor device according to claim 1, wherein the pattern of the sidewall spacer mask transferred to the mask material in the first region is partially removed so as to form a line-and-space pattern of the sidewall spacer mask by etching.

3. The method of fabricating a semiconductor device according to claim 2, further comprising:
    simultaneously transferring both the pattern of the partially removed mask material in the first region and the predetermined pattern of the mask material in the second region to the semiconductor substrate, thereby forming fins used for a memory cell in the first region and an active region where a peripheral circuit is formed in the second region.

4. The method of fabricating a semiconductor device according to claim 2, wherein the partial removal of the pattern of the sidewall spacer mask transferred to the mask material in the first region comprises splitting the pattern of the sidewall spacer mask into two line patterns by removing end portions thereof in a longitudinal direction and dividing one of the line patterns.

5. The method of fabricating a semiconductor device according to claim 4, further comprising:
    simultaneously transferring both a pattern of the partially removed mask material in the first region and the predetermined pattern of the mask material in the second region to the semiconductor substrate, thereby forming fin used for a memory cell in the first region and an active region where a peripheral circuit is formed in the second region.

6. The method of fabricating a semiconductor device according to claim 1, wherein the core pattern is formed using a photolithography technique using a first photomask in a critical design level;
    after forming a resist film having a pattern larger than the predetermined pattern on the mask material in the second region using a photolithography technique by using a second photomask of which accuracy of designed pattern size is lower than that of the first photomask, the pattern of the sidewall spacer mask is transferred to the mask material in the first region by etching using the resist film as a mask; and
    the removal of the predetermined parts of the pattern of the sidewall spacer mask transferred to the mask material in the first region and the formation of the predetermined pattern on the mask material in the second region are simultaneously carried out using a photolithography technique using a third photomask in a critical design level.

7. The method of fabricating a semiconductor device according to claim 6, wherein the second photomask is a photomask in a noncritical design level, and has the accuracy of the pattern size is less than that of the first photomask.

8. The method of fabricating a semiconductor device according to claim 6, wherein a ring-shaped pattern of the sidewall spacer mask transferred to the mask material in the first region is partially removed so as to form a line-and-space pattern of the sidewall spacer mask by etching.

9. The method of fabricating a semiconductor device according to claim 8, further comprising:
    simultaneously transferring both the pattern of the partially removed mask material in the first region and the predetermined pattern of the mask material in the second region to the semiconductor substrate, thereby forming fin used for a memory cell in the first region and an active region where a peripheral circuit is formed in the second region.

10. The method of fabricating a semiconductor device according to claim 8, wherein the partial removal of the pattern of the sidewall spacer mask transferred to the mask material in the first region comprises splitting the pattern of the sidewall spacer mask into two line patterns by removing end portions thereof in a longitudinal direction and dividing one of the line patterns.

11. The method of fabricating a semiconductor device according to claim 10, further comprising:

simultaneously transferring both the pattern of the partially removed mask material in the first region and the predetermined pattern of the mask material in the second region to the semiconductor substrate, thereby forming fins used for a memory cell in the first region and an active region where a peripheral circuit is formed in the second region.

12. A method of fabricating a semiconductor device, comprising:

forming a mask material on a semiconductor substrate;

shaping the mask material, thereby forming a region with a ring pattern formed thereon and a region without ring pattern; and thereafter, carrying out removal of predetermined parts of the ring pattern of the mask material for forming a line-and-space pattern of the mask material and simultaneously carrying out formation of a predetermined pattern in the region of the mask material without ring pattern by using a photolithography technique using a photomask having both a pattern for partial removal of a ring pattern of a workpiece material to form a line-and-space pattern and a pattern for forming a predetermined pattern in a region of the workpiece material without ring pattern.

13. The method of fabricating a semiconductor device according to claim 12, further comprising:

simultaneously transferring both the line-and-space pattern and the predetermined pattern of the mask material to the semiconductor substrate, thereby forming fins used for a memory cell and an active region where a peripheral circuit is formed.

14. The method of fabricating a semiconductor device according to claim 12, wherein the removal of the predetermined parts of the ring pattern of the mask material comprises splitting the ring pattern into two line patterns by removing end portions thereof in a longitudinal direction and dividing one of the line patterns.

15. The method of fabricating a semiconductor device according to claim 14, further comprising:

simultaneously transferring both the line-and-space pattern and the predetermined pattern of the mask material to the semiconductor substrate, thereby forming fins used for a memory cell and an active region where a peripheral circuit is formed.

* * * * *